United States Patent [19]
Sedin

[11] 3,787,772
[45] Jan. 22, 1974

[54] F. M. TRANSMITTER EMPLOYING MAGNETICALLY MODULATED FERRIMAGNETIC RESONATOR

[75] Inventor: James W. Sedin, Mountain View, Calif.

[73] Assignee: Ryka Scientific, Inc., Sunnyvale, Calif.

[22] Filed: June 5, 1972

[21] Appl. No.: 259,485

[52] U.S. Cl. .................... 325/171, 325/47, 325/148, 332/16 R, 332/26
[51] Int. Cl. .............................................. H04b 1/04
[58] Field of Search ....... 325/45, 47, 120, 121, 145, 325/146, 148, 153, 171; 332/5, 16, 16 T, 19, 21, 26, 29 M, 51

[56] References Cited
UNITED STATES PATENTS

| | | | |
|---|---|---|---|
| 3,102,243 | 8/1963 | Zaleski | 325/45 |
| 2,556,226 | 6/1951 | Shadowitz et al. | 325/148 |

*Primary Examiner*—Benedict V. Safourek
*Assistant Examiner*—Marc E. Bookbinder
*Attorney, Agent, or Firm*—Stanley Z. Cole et al.

[57] ABSTRACT

A ferrimagnetic crystal resonator is employed as the frequency determinative element of a radio frequency oscillator. The ferrimagnetic crystal is disposed in the gap of a magnet and the magnetic field is modulated in intensity in accordance with an audio AM signal to be impressed on the carrier. The audio AM modulation of the magnetic field of the magnet is converted into frequency modulation of the carrier frequency of the ferrimagnetic crystal controlled oscillator. An internally generated stable reference radio frequency signal is compared with a sample of the FM output signal to produce an error signal for correcting the average magnetic field intensity for controlling the average or carrier frequency of the FM transmitter.

6 Claims, 3 Drawing Figures

F. M. TRANSMITTER EMPLOYING MAGNETICALLY MODULATED FERRIMAGNETIC RESONATOR

DESCRIPTION OF THE PRIOR ART

Heretofore, FM transmitters for producing milliwatts of output power in the frequency range around 950 MHz have employed a crystal oscillator operating in the frequency range of 20 to 25 MHz. The crystal oscillator frequency was frequency modulated with an audio signal by means of a varactor or other tuning element. This FM signal was then frequency multiplied by a factor of approximately 40 to produce the output FM signal at around 950 MHz.

The problem with this prior art crystal control FM transmitter is that it is relatively inefficient for converting DC power to radio frequency energy at 950 MHz. In addition, the circuitry is relatively complex due to the relatively large number of multiplier stages, each of which requires rather complex filter circuitry for removing unwanted harmonics. For example, the prior art FM transmitter required approximately 3.5 watts of power drain to produce 100 milliwatts of output power at 950 MHz. When such an FM transmitter is to be employed as a wireless microphone, the relatively high power consumption requires relatively large batteries for a moderate operating life. It would be desirable to provide an improved FM transmitter with substantially reduced power drain.

SUMMARY OF THE PRESENT INVENTION

The principal object of the present invention is the provision of an improved F. M. transmitter.

In one feature of the present invention, a ferrimagnetic crystal resonator body is employed as a primary frequency determinative element of the transmitted signal and the magnetic field intensity applied to the ferrimagnetic crystal resonator body is modulated in intensity with the audio signal to be transmitted for converting the AM modulation of the magnetic field into FM modulation of the output radio frequency signal, whereby efficient AM to FM conversion is obtained at radio frequencies.

In another feature of the present invention, the average frequency of the ferrimagnetic crystal resonator is controlled by comparing a piezoelectric crystal stabilized reference frequency with the output frequency of the transmitter to derive an error signal for controlling the average intensity of the magnetic field applied to the ferrimagnetic crystal resonator body, whereby the average frequency of the FM transmitter is stabilized.

Other features and advantages of the present invention will become apparent upon a perusal of the following specification taken in connection with the accompanying drawings wherein:

DESCRIPTION OF THE PREFERRED EMBODIMENTS

Figure 1:
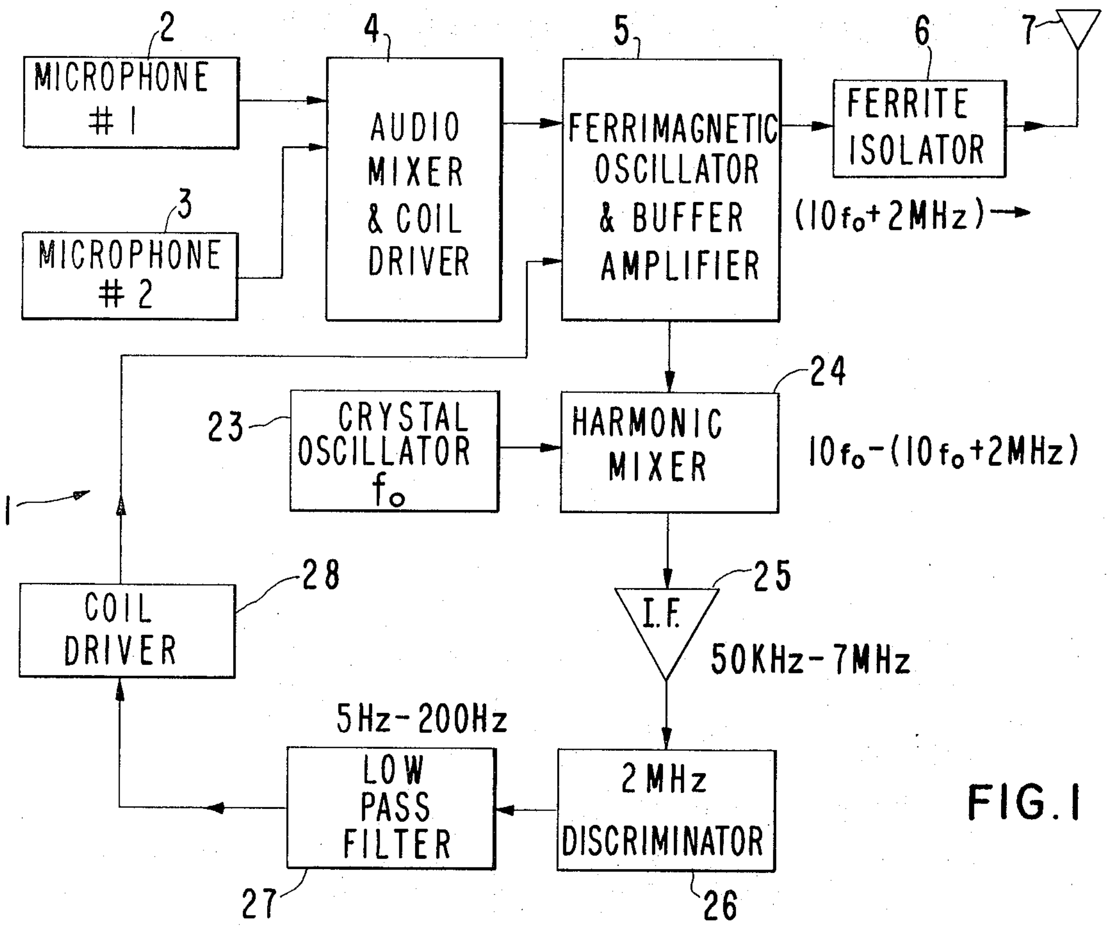
FIG. 1 is a schematic block diagram of an FM transmitter incorporating features of the present invention.

Referring now to FIG. 1, there is shown a radio frequency FM transmitter circuit 1 incorporating features of the present invention. The FM transmitter 1 includes a pair of microphones 2 and 3 for picking up audio signals to be transmitted. The two audio signals are thence fed into the input of an audio mixer and coil driver 4 wherein the audio signals are amplified and thence fed to the input of a ferrimagnetic oscillator and buffer amplifier 5 for modulating the output frequency of the ferrimagnetic oscillator.

The frequency modulated radio frequency output of the ferrimagnetic oscillator and buffer amplifier 5 is thence fed through a ferrite isolator 6 to an antenna 7 for transmission to a receiver disposed at a remote location. The ferrite isolator 6 isolates the ferrimagnetic oscillator and buffer amplifier 5 from power reflected from the antenna 7.

Figure 2:
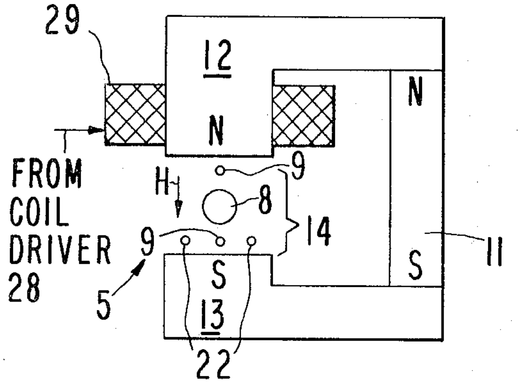
FIG. 2 is a schematic line diagram of a magnetic circuit for a ferrimagnetic crystal oscillator employed in the circuit of FIG. 1.
Figure 3:
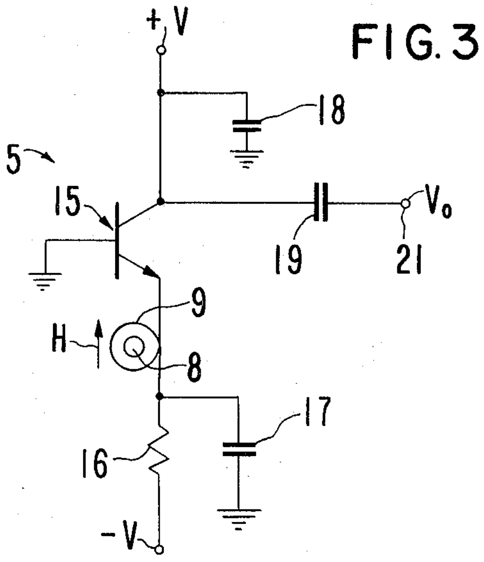
FIG. 3 is a schematic circuit diagram of a ferrimagnetic transistor oscillator employed in the circuit of FIG. 1.

Referring now to FIGS. 2 and 3, there is shown the ferrimagnetic oscillator 5 of the present invention. The ferrimagnetic oscillator includes a ferrimagnetic crystal resonator body 8, such as a yttrium garnet, lithium-ferrite crystal or a gallium-yttrium garnet crystal. An electrically conductive coil or loop 9 is disposed at least partially encircling the ferrimagnetic crystal 8 for magnetically coupling to the crystal at radio frequency. The crystal 8 is disposed in a polarizing magnetic field of intensity $H$. The ferrimagnetic crystal 8 has a resonant frequency $f_o = \gamma H$ where $\gamma$ is the gyromagnetic ratio for electrons and $H$ is the intensity of the polarizing magnetic field.

In a typical example of the present invention the intensity $H$ of the magnetic field is such that $f_o$ is approximately 950 MHz. The magnetic field is produced by a permanent magnet 11 disposed to energize a pair of pole pieces 12 and 13 spaced apart to define a magnetic gap 14 therebetween. The ferrimagnetic crystal 8 is disposed in the gap 14 of the magnet.

The ferrimagnetic oscillator circuit 5 (see FIG. 3) includes a transistor 15 having the ferrimagnetic resonator crystal 8 magnetically coupled in series with the emitter lead to a source of negative potential −V via a biasing resistor 16. A capacitor 17 bypasses resistor 16 to ground. The collector of the transistor 15 is connected to a source of positive potential +V. The source of positive potential +V is bypassed to ground via bypass capacitor 18. Output radio frequency energy is coupled from the collector via a coupling capacitor 19 to an output terminal 21. Varying the intensity $H$ of the polarizing magnetic field applied to the ferrimagnetic resonator crystal 8 tunes the output frequency of the oscillator 5.

The output of the audio mixer and coil driver 4 (FIG. 1) is fed to drive a coil 22 (shown in cross section in FIG. 2) in the gap 14 of the magnet. Coil 22 is oriented to superimpose a magnetic field component on and parallel to the polarizing magnetic field vector $H$ such as to vary the instantaneous intensity $H$ of the polarizing magnetic field to produce a corresponding instantaneous frequency deviation of the output frequency of the oscillator 5. Thus, by driving coil 22 with the audio frequency output of the audio mixer and coil driver 4 there is produced a corresponding frequency deviation in the output frequency of the oscillator 5, such frequency deviation being at the frequency of the audio frequency signal and of a frequency deviation related to the modulation depth of the AM signal. In this manner, the audio AM modulation at the output of the audio mixer and coil driver 4 is converted into frequency modulation of the output frequency of the ferrimagnetic oscillator 5.

Referring again to FIG. 1, the FM transmitter 1 also includes a frequency control lock for controlling the average frequency of the ferrimagnetic oscillator to a desired reference frequency. More particularly, a crystal oscillator 23 provides a reference frequency $f_o$ at a relatively high radio frequency as of 95 MHz, i.e., approximately 1/10th the output frequency of the transmitter 1. The reference frequency $f_o$ is fed from the crystal oscillator 23 to one input of a harmonic mixer 24 for mixing with a sample of the output of the ferrimagnetic oscillator and buffer amplifier 5. In a typical example, the output power of the ferrimagnetic oscillator which is fed to the antenna 7 is approximately 100 milliwatts, whereas the power fed to the harmonic mixer 24 from each of sources 5 and 23 is approximately 1 milliwatt.

The output of the harmonic mixer 24 is fed to an IF amplifier 25 for amplifying signals in the relatively narrow frequency range of 50 KHz to 7 MHz. The output of the IF amplifier 25 is fed to the input of a 2 MHz frequency discriminator 26 which produces a DC output of positive or negative voltage depending upon whether the output frequency of the IF amplifier is above or below 2 MHz. Thus, the disciminator 26 is set to control the output of the ferrimagnetic oscillator 5 so that it has an average frequency 2 MHz different from that of the tenth harmonic of the crystal oscillator 23.

The output of the frequency discriminator 26 is fed through a low pass filter 27 having a high frequency cutoff preferably between 5 and 200 Hz. The output of the low pass filter 27 is fed to the input of a coil driver 28 which amplifies the signal and drives a winding 29 around one of the magnet pole pieces 12 (see FIG. 2) for causing the average intensity $H$ of the magnetic field to be controlled to a value which causes the output frequency of the ferrimagnetic oscillator 5 to have an average frequency 2 MHz different from the tenth harmonic of the frequency $f_o$ of the crystal oscillator 23. Thus, in a typical example, if the crystal oscillator 23 has an output frequency $f_o$ of 95 MHz and the frequency discriminator 26 is set for 2 MHz, the average output frequency of the ferrimagnetic oscillator is controlled to $10 \times 95 + 2$ or 952 MHz.

The advantage of the FM transmitter 1 of the present invention is that use of the ferrimagnetic oscillator as the primary source of radio frequency energy for the FM transmitter greatly reduces the power drain for the transmitter. In a typical example the power drain of the FM transmitter 1 to produce 100 milliwatts at 950 MHz is approximately 0.5 watt, thereby obtaining a total conversion efficiency of approximately 20 percent. This is to be contrasted with the prior art crystal FM transmitter which had a power drain for the same power output and frequency of approximately 3.5 watts, a conversion efficiency of less than three percent. Thus by utilizing the FM transmitter 1 of the present invention, the battery requirements for the same operating life can be drastically reduced, that is by approximately a factor of seven. This reduction in battery size, which is the predominant size determining element of the F. M. transmitter, allows the total size of the transmitter to be reduced such that it can be readily concealed on the person of a performer, whereas the prior F. M. transmitter was of such a size that it could not be so concealed.

While the above description contains many specificities, these should not be construed as limitations upon the scope of the invention, but merely as an exemplification of the preferred embodiments thereof. The intended scope of the invention is indicated by the following claims and their legal equivalents.

What is claimed is:

1. In a frequency modulation transmitter, magnet means having a gap and providing a magnetic field in said gap, a ferrimagnetic crystal resonator body disposed in the gap of said magnet means, a radio frequency oscillator circuit including transistor means having, base, emitter, and collector terminals, electrical circuit means coupled to said ferrimagnetic crystal resonator body in radio frequency energy exchanging relation therewith for controlling the operating frequency of said radio frequency oscillator circuit, said resonator body being magnetically coupled in circuit with said transistor means, audio frequency circuit means for modulating the intensity of said magnetic field in said gap in accordance with an audio frequency signal to be transmitted for modulating the operating frequency of said radio frequency circuit at the frequency of said audio signal and with a frequency deviation in accordance with the amplitude of said audio signal, and antenna means coupled to said radio frequency circuit means for radiating frequency-modulated radio energy.

2. The apparatus of claim 1 including, means for generating a reference radio frequency, means for comparing said frequency modulated radio frequency signal with said reference frequency signal to derive an error signal, and means responsive to said error signal for controlling the average intensity of said magnetic field of said magnet means as applied to said ferrimagnetic resonator body for controlling the average resonant frequency of said ferrimagnetic resonator body.

3. The apparatus of claim 2 wherein said means for deriving a reference radio frequency includes crystal controlled oscillator means for supplying a reference radio frequency signal, and wherein said means for comparing said reference frequency signal with said frequency modulated radio frequency signal includes mixer means for mixing the reference radio frequency signal with a sample of said frequency modulated radio frequency signal to produce a difference frequency signal, and frequency discriminator means for comparing the difference frequency with a reference difference frequency to derive said error signal.

4. The apparatus of claim 1 including, microphone means for receiving audio wave energy and for converting same into said audio frequency signal to be transmitted.

5. The apparatus of claim 2 wherein said means for controlling the average intensity of said magnetic field in accordance with said error signal includes auxilliary electromagnetic coil means carried on said magnet means for superimposing a corrective magnetic field component on the magnetic field in said gap of said magnet.

6. The apparatus of claim 2 wherein said radio frequency circuit means includes, transistor means having base, emitter and collector terminals connected as a radio frequency oscillator, and wherein said ferrimagnetic crystal resonator body is magnetically coupled in circuit with said transistor means for controlling the operating radio frequency of said radio frequency oscillator.

* * * * *